United States Patent
Zhang (10) Patent No.: US 12,199,463 B2
(45) Date of Patent: Jan. 14, 2025

(54) SYSTEM AND METHOD FOR RECHARGING A BATTERY

(71) Applicant: Texas Instruments Incorporated, Dallas, TX (US)

(72) Inventor: Chutao Zhang, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 742 days.

(21) Appl. No.: 17/331,678

(22) Filed: May 27, 2021

(65) Prior Publication Data
US 2022/0173604 A1 Jun. 2, 2022

Related U.S. Application Data

(60) Provisional application No. 63/119,727, filed on Dec. 1, 2020.

(51) Int. Cl.
*H02J 7/00* (2006.01)
*G01R 31/3842* (2019.01)

(52) U.S. Cl.
CPC ...... *H02J 7/00712* (2020.01); *G01R 31/3842* (2019.01); *H02J 7/007192* (2020.01)

(58) Field of Classification Search
CPC .................................................. H02J 7/00712
USPC ....................................................... 320/134
See application file for complete search history.

(56) References Cited

U.S. PATENT DOCUMENTS

| | | | | |
|---|---|---|---|---|
| 8,988,045 B2* | 3/2015 | Klein | ................... | H01M 10/448 320/155 |
| 11,545,703 B2* | 1/2023 | Huo | ...................... | H01M 10/44 |
| 2010/0201323 A1* | 8/2010 | Okamura | ............... | H02J 7/0031 320/134 |
| 2014/0203781 A1* | 7/2014 | Yun | ...................... | H02J 7/00712 320/112 |
| 2015/0226807 A1* | 8/2015 | Aumentado | .......... | G01R 31/389 702/63 |

(Continued)

OTHER PUBLICATIONS

"BQ27Z561-R2 Impedance Track™ Battery Gas Gauge Solution for 1-Series Cell Li-Ion Battery Packs", product data sheet, Texas Instruments, SLUSE22—Sep. 2020.

(Continued)

*Primary Examiner* — Yalkew Fantu
(74) *Attorney, Agent, or Firm* — Ray A. King; Frank D. Cimino (57) ABSTRACT

A method includes detecting a voltage of the battery, detecting a current of the battery, determining a depth of discharge of the battery based on the voltage and the current of the battery, and controlling terminating charging of the battery responsive to the determined depth of discharge of the battery reaching a depth of discharge threshold. A system includes a battery gauge circuit and a processor coupled to the battery gauge circuit. The battery gauge circuit has a voltage sense input and a current sense input and is configured to determine a depth of discharge of a battery based on a battery voltage at the voltage sense input and a battery current at the current sense input. The processor is configured to control terminating charging of the battery responsive to the determined depth of discharge reaching a depth of discharge threshold.

14 Claims, 8 Drawing Sheets

(56) References Cited

U.S. PATENT DOCUMENTS

2015/0318724 A1* 11/2015 Brockman .......... H01M 10/482
 320/152
2020/0166581 A1* 5/2020 Ukumori ............... H01M 10/48

OTHER PUBLICATIONS

"BQ25306 Standalone 17-V, 3.0-A 1-2 Cell Buck Battery Charger", product data sheet, Texas Instruments, SLUSDC7A—Mar. 2020—Revised Nov. 2020.

"bq27530-G1 Battery Management Unit Impedance Track™ Fuel Gauge with MaxLife™ Technology for Use with the pq2416x Charger Controller", product data sheet, Texas Instruments, SLUSAL5C—Dec. 2012—Revised Jun. 2016.

Hongwen He *, Rui Xiong and Jinxin Fan, "Evaluation of Lithium-Ion Battery Equivalent Circuit Models for State of Charge Estimation by an Experimental Approach", Energies 2011, 4, 582-598; doi: 10.3390/en4040582, ISSN 1996-1073, Published: Mar. 29, 2011.

* cited by examiner

SYSTEM AND METHOD FOR RECHARGING A BATTERY

CROSS-REFERENCE TO RELATED APPLICATION

This application claims priority to, and the benefit of, U.S. provisional patent application No. 63/119,727, entitled "Charge Termination Based on Depth of Discharge for Li-Ion Battery", and filed on Dec. 1, 2020, the entirety of which is hereby incorporated by reference.

BACKGROUND

Rechargeable battery packs are found in many consumer electronic products such as smart phones, laptop computers, tablets and the like. Charging of lithium ion or lithium polymer (LIPO) batteries may be performed using constant current/constant voltage (CC/CV) or fast charging technology such as fast flash charging (FFC). Following charging termination, however, the battery pack may be undercharged or over-charged, for example, at low temperature and/or for aged battery cells. Undercharging a battery leads to lower device operating time before recharging is again needed. Overcharging a battery can lead to faster aging, swelling, and/or cell failure.

SUMMARY

In one aspect, a method includes detecting a voltage and a current of a battery, determining a depth of discharge (DOD) of the battery based on the voltage and current of the battery, and controlling terminating charging of the battery responsive to the determined depth of discharge of the battery reaching a depth of discharge threshold.

In another aspect, a system includes a battery gauge circuit and a processor coupled to the battery gauge circuit. The battery gauge circuit has a voltage sense input and a current sense input and is configured to determine a depth of discharge of a battery based on a battery voltage at the voltage sense input and a battery current at the current sense input. The processor is configured to control terminating charging of the battery responsive to the determined depth of discharge reaching a depth of discharge threshold.

In a further aspect, an electronic device includes a battery, a battery gauge circuit, a charging circuit, and a processor. The battery gauge circuit has a gauge voltage sense input, a gauge current sense input, and a gauge communications interface. The gauge voltage sense input is coupled to first and second terminals of the battery. The battery gauge circuit is configured to compute a depth of discharge of the battery based on a battery voltage measured at the gauge voltage sense input and a battery current measured at the gauge current sense input. The processor is coupled to the battery gauge circuit and the charging circuit. The processor is configured to control the charging circuit to terminate charging of the battery responsive to the depth of discharge reaching a depth of discharge threshold.

DETAILED DESCRIPTION

In the drawings, like reference numerals refer to like elements throughout, and the various features are not necessarily drawn to scale. Also, the term "couple" or "couples" includes indirect or direct electrical or mechanical connections or combinations thereof. For example, if a first device couples to or is coupled with a second device, that coupling may be through a direct electrical connection, or through an indirect electrical connection via one or more intervening devices and connections. One or more operational characteristics of various circuits, systems, and/or components are hereinafter described in the context of functions which in some cases result from configuration and/or interconnection of various structures when circuitry is powered and operating.

Figure 1:
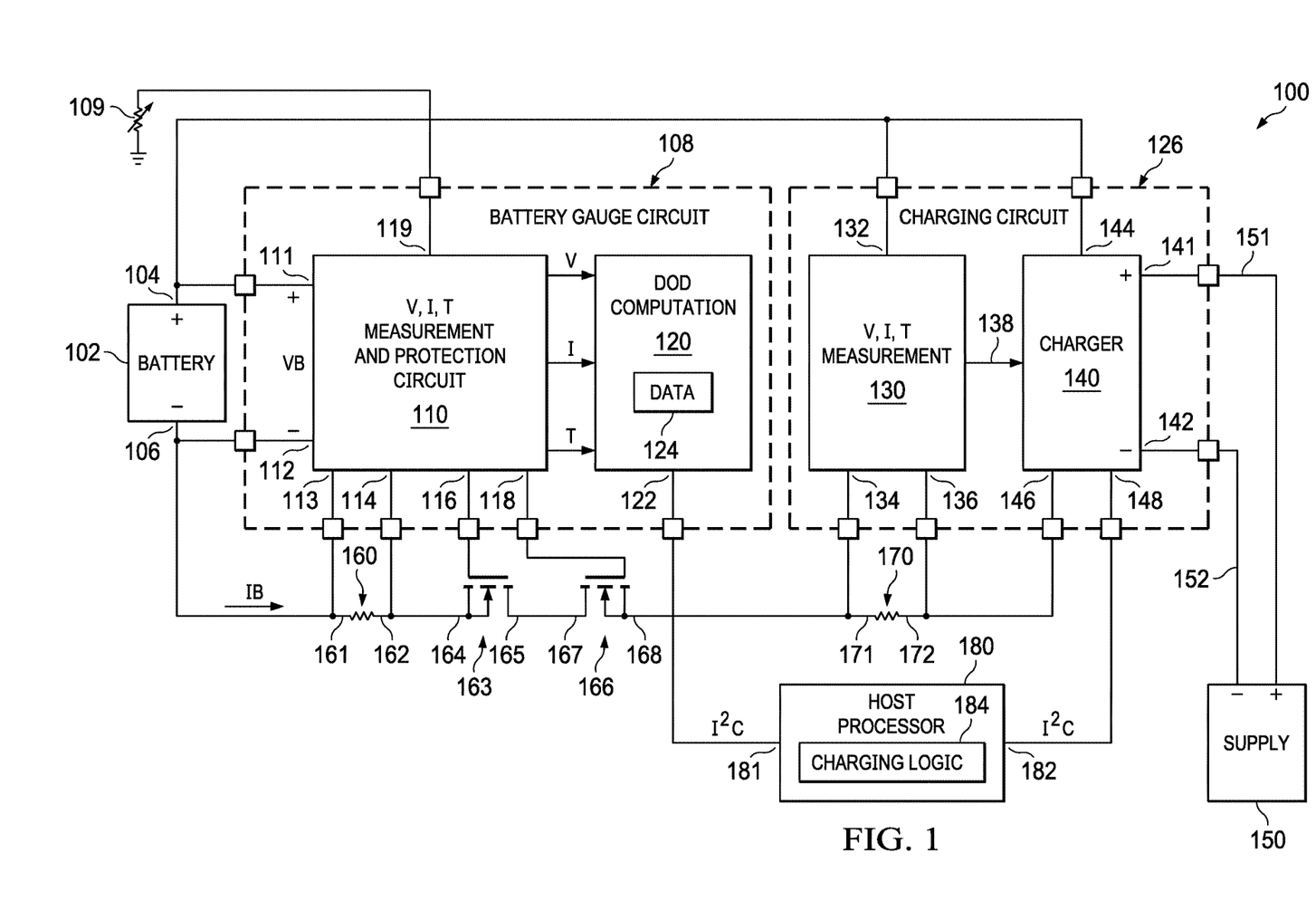
FIG. 1 is a schematic diagram of a battery charging system to charge a battery according to depth of discharge.

FIG. 1 shows a battery charging system 100 to charge a battery 102 according to depth of discharge (DOD). Depth of discharge is the fraction or percentage of the capacity which has been removed from a fully charged battery. DOD is an alternative method to indicate a battery's state of charge (SOC). Namely, DOD is the complement of SOC: as one increases, the other decreases. The battery charging system 100 includes the battery 102, a battery gauge circuit 108, a thermistor 109, a charging circuit 126, a DC power supply 150, a first current sense resistor 160, a first field-effect transistor (FET) 163, a second FET 166, a second current sense resistor 170, and a processor 180 (e.g., a processor of a host system, referred to as a host processor). In one example, the battery gauge circuit 108 and the charging circuit 126 are in separated integrated circuit (IC) packages. In another example, the battery gauge circuit 108 and the charging circuit 126 are in separate ICs in the same package. In another example, the battery gauge circuit 108 and the charging circuit 126 are on the same IC. In the example of FIG. 1, the host processor 180 is in a separate IC package and a separate device from the battery gauge circuit 108 and the charging circuit 126.

The battery 102 has a first battery terminal 104 (e.g., labeled "+") and a second battery terminal 106 (e.g., labeled "−"). The battery 102 has a battery voltage VB. In operation during charging, the battery 102 conducts a battery current IB. The battery charging system 100 in one example is compatible with a lithium ion or a lithium polymer battery as the battery 102.

The battery gauge circuit 108 is coupled to the thermistor 109. The battery gauge circuit 108 includes a voltage, current, and temperature (V, I, T) measurement and protection circuit 110 and a DOD computation circuit 120.

The voltage, current, and temperature measurement and protection circuit 110 has a gauge voltage sense input with a first gauge voltage sense input terminal 111 and a second gauge voltage sense input terminal 112. In one example, the voltage, current, and temperature measurement and protection circuit 110 includes a protector integrated circuit, resistors and capacitors. The voltage, current, and temperature measurement and protection circuit 110 also has a gauge current sense input with a first gauge current sense input terminal 113 and a second gauge current sense input terminal 114. The voltage, current, and temperature measurement and protection circuit 110 also has a first gate control output terminal 116 and a second gate control output terminal 118. The voltage, current, and temperature measurement and protection circuit 110 has a temperature sense input terminal 119 coupled to the thermistor 109. The voltage, current, and temperature measurement and protection circuit 110 receives a signal at the temperature sense input terminal 119, from the thermistor 109, which represents a present temperature of the battery 102.

The DOD computation circuit 120 has a gauge communications interface 122 and stores data 124, e.g., including DOD computation data, related to the connected battery 102. The DOD computation circuit 120 in one example includes a gauge device with an internal microcontroller. In one example, the gauge communications interface 122 is a serial data communications interface with one or more terminals. The battery gauge circuit 108 in one example is or includes a gas gauge integrated circuit (IC) or a battery management IC, such as a BQ40Z80 device available from Texas Instruments, Inc. of Dallas, Texas. In operation, the battery gauge circuit 108 measures battery V, I, and T conditions, computes the DOD, and maintains an accurate record in the data 124 including available capacity (e.g., DOD and/or state of charge SOC), voltage (V), current (I), temperature (T), and other parameters related to the battery 102.

The DOD computation circuit 120 in one example includes a processor circuit (not shown) that receives the V, I, and T readings from the voltage, current, and temperature measurement and protection circuit 110 and determines (e.g., computes) the present DOD periodically, such as every 1 second, for instance as later described. The voltage, current, and temperature measurement and protection circuit 110 generates an output signal or value V to the DOD computation circuit 120 representing the sensed battery voltage VB based on the voltage across the first gauge voltage sense input terminal 111 and the second gauge voltage sense input terminal 112. The voltage, current, and temperature measurement and protection circuit 110 generates an output signal or value I to the DOD computation circuit 120 representing the sensed battery current IB based on the voltage across the first gauge current sense input terminal 113 and the second gauge current sense input terminal 114. The voltage, current, and temperature measurement and protection circuit 110 also generates an output signal or value T to the DOD computation circuit 120 representing the sensed battery temperature based on the battery temperature signal, e.g., voltage, at the temperature sense input terminal 119.

In response to receiving V and I, the DOD computation circuit 120 determines the DOD based on the battery voltage VB measured at the gauge voltage sense input terminals 111 and 112 and based on the battery current IB measured at the gauge current sense input terminals 113 and 114. In one implementation, in response to receiving T, the DOD computation circuit 120 also determines the DOD of the battery 102 based on a battery temperature signal received at the gauge temperature sense input terminal 119. The battery gauge circuit 108 reports the present DOD by communications messaging over the gauge communications interface 122. In one example, the gauge communications interface 122 is an inter-integrated circuit ($I^2C$) bus or a system management bus (SMBus) v1.1 compatible interface.

The charging circuit 126 has a voltage, current, and temperature (V, I, T) measurement circuit 130 and a charger 140. In at least one example, the charging circuit 126 is or includes a BQ25306 integrated standalone switch-mode battery charger packaged electronic device available from Texas Instruments Incorporated of Dallas Texas. The voltage, current, and temperature measurement circuit 130 has a charger voltage sense input 132, and a charger current sense input having a first charger current sense input terminal 134 and a second charger current sense input terminal 136. In one example, the voltage, current, and temperature measurement circuit 130 includes an internal temperature sensor (not shown) or an input to receive a signal from a temperature sensor (not shown). The charger voltage sense input 132 is coupled to the first battery terminal 104 and senses a voltage at the first battery terminal 104 relative to the voltage at the first charger current sense input terminal 134. The voltage, current, and temperature measurement circuit 130 also has an output 138 that provides feedback signaling to the charger 140 for controlled closed loop charging operation.

The charger 140 has a DC power input having a first power input terminal 141 (e.g., labeled "+") and a second power input terminal 142 (e.g., labeled "−"). The charger 140 also has a charger output having a first charger output terminal 144 and a second charger output terminal 146. The charger 140 has a charger communications interface 148, such as an $I^2C$ bus or an SMBus v1.1 compatible interface. The charging circuit 126 delivers a charging current at the output 144, 146 to charge the battery 102 responsive to a command received at the charger communications interface 148.

The DC power supply 150 has a power output having a first supply output terminal 151 (e.g., labeled "+") and a second supply output terminal 152 (e.g., labeled "−"). The first supply output terminal 151 is coupled to the first power input terminal 141 of the charger 140, and the second supply output terminal 152 is coupled to the second power input terminal 142 of the charger 140. When powered and operating, the DC power supply 150 provides a DC supply voltage across the first supply output terminal 151 and the second supply output terminal 152.

The first current sense resistor 160 has a first terminal 161 and a second terminal 162. The first terminal 161 of the first current sense resistor 160 is coupled to the second battery terminal 106 and to the first gauge current sense input terminal 113. The second terminal 162 of the first current sense resistor 160 is coupled to the second gauge current sense input terminal 114. When the battery 102 conducts the battery current IB, the current IB flows through the first current sense resistor 160 to develop a voltage across the first gauge current sense input terminal 113 and the second gauge current sense input terminal 114, which voltage is sensed by the voltage, current, and temperature measurement and protection circuit 110. The voltage, current, and temperature measurement and protection circuit 110 generates the output signal or value I to the DOD computation circuit 120 representing the sensed battery current IB based on the voltage across the first gauge current sense input terminal 113 and the second gauge current sense input terminal 114.

The battery charging system 100 also includes protection circuitry operated by gate control signals at the first and second gate control output terminals 116 and 118 of the voltage, current, and temperature measurement and protection circuit 110. The illustrated example includes the first FET 163 and the second FET 166 coupled in series with the first FET 163. The first FET 163 has a source 164, a drain 165 and a gate. The source 164 is coupled to the second gauge current sense input terminal 114 and to the second terminal 162 of the first current sense resistor 160. The gate of the first FET 163 is coupled to the first gate control output terminal 116. The second FET 166 has a source 167, a drain 168 and a gate. The source 167 of the second FET 166 is coupled to the drain 165 of the first FET 163. The gate of the second FET 166 is coupled to the second gate control output terminal 118 of the voltage, current, and temperature measurement and protection circuit 110.

The second current sense resistor 170 is used for current sensing by the voltage, current, and temperature measurement circuit 130. The second current sense resistor 170 has a first terminal 171 and a second terminal 172. The first terminal 171 of the second current sense resistor 170 is coupled to the drain 168 of the second FET 166 and to the first charger current sense input terminal 134. The second terminal 172 of the second current sense resistor 170 is coupled to the second charger current sense input terminal 136 and to the second charger output terminal 146.

During battery charging operations, the voltage, current, and temperature measurement and protection circuit 110 provides active high gate control signals at the first and second gate control output terminals 116 and 118 to turn on the respective first and second FETs 163 and 166. For charging, current flows in a first (e.g., charging) direction from the first charger output terminal 144 through the battery 102, and thereafter through the first current sense resistor 160, the first FET 163, the second FET 166, and the second current sense resistor 170 to the second charger output terminal 146. The charger 140, in one example, selectively implements discharging operations, in which the battery current IB flows in the opposite direction from the second charger output terminal 146 through the second current sense resistor 170, the second FET 166, the first FET 163, the first current sense resistor 160, and the battery 102 to return to the first charger output terminal 144.

The host processor 180 has a first communications interface 181 and a second communications interface 182 and includes charging logic 184. In one example, the host processor 180 is a programmable device operating according to program instructions, also referred to as executable instructions, stored in an internal or connected electronic memory (not shown in FIG. 1) to implement the charging logic 184. The first communications interface 181 is coupled to the gauge communications interface 122. The second communications interface 182 is coupled to the charger communications interface 148. The host processor 180 is configured by program instructions that implement the charging logic 184 to control the charging circuit 126 to terminate charging of the battery 102. The host processor terminates the charging responsive to the determined DOD of the battery 102 reaching a depth of discharge threshold. In this manner, the battery charging accuracy and precision is improved compared with charging termination based solely on reaching a voltage and a current, particularly for aged and/or cold batteries 102.

In this example, the DOD computation circuit 120 of the battery gauge circuit 108 determines (e.g., calculates or computes) the DOD. The host processor 180 reads the DOD from the DOD computation circuit 120 by suitable messaging using the communications interfaces 122 and 181. The host processor 180, in one example, implements a dual-mode or two-step charging to charge the battery 102. The dual-mode charging includes a first charging operation and a second charging operation. In the first charging operation, the host processor 180 controls the charging circuit 126 to charge the battery 102 and terminates charging responsive to: 1) a voltage at the charger voltage sense input 132 reaching a first voltage value relative to the voltage at the first charger current sense input terminal 134; and 2) the battery current sensed at the charger current sense input 134, 136 reaching a first current value.

In one implementation, the host processor 180 initiates the first charging operation by providing a first command at the second communications interface 182 to control the charging circuit 126 to charge the battery 102 in the first charging operation. In this example, the first command includes the first voltage value and the first current value. The charger 140 performs closed loop charging according to the voltage, current, and temperature feedback from the voltage, current, and temperature measurement circuit 130. The charger 140 performs closed loop charging in this example in one of two selectable modes, including constant current/constant voltage (CC/CV) charging and fast/charging (FFC) during the first charging operation.

In one example, the charger 140 performs the first charging operation responsive to the first command from the host processor 180. The charger 140 terminates the first charging operation responsive to: the voltage at the charger voltage sense input 132 reaching the first voltage value relative to the voltage at the first charger current sense input terminal 134; and the battery current sensed at the charger current sense input 134, 136 reaching the first current value. In this example, the charger 140 reports termination of the first charging operation to the host processor 180 via the communications interfaces 148 and 182. In another example, the charger 140 periodically reports the voltage and current values received from the voltage, current, and temperature measurement circuit 130 to the host processor 180 during the first charging operation. The host processor 180 commands the charger 140 to terminate the first charging operation responsive to the reported voltage and current reaching the first voltage and first current values, respectively. In one implementation, the battery gauge circuit 108 determines (e.g., computes) the DOD of the battery 102 periodically during the first charging operation. The host processor 180 reads the determined DOD of the battery 102 from the battery gauge circuit 108 periodically during the first charging operation.

In response to termination of the first charging operation, the host processor 180 controls the charger 140 to start additional charging during the second charging operation and terminates the second charging operation responsive to the determined DOD reaching the DOD threshold. The DOD threshold in one example is zero. In another example, the DOD threshold is a non-zero DOD value to facilitate nearly full charging of the battery 102 based on a compromise between available capacity, cycle life, and charge time. In one implementation, the DOD threshold is configurable. In one example, the host processor 180 provides a second command at the second communications interface 182 to control the charging circuit 126 to further charge the battery 102 in the second charging operation. In one example, the host processor 180 controls the charging circuit 126 to further charge the battery 102 in the second charging operation and terminates the second charging operation responsive to the determined DOD of the battery 102 reaching the DOD threshold. In one example, the host processor 180 provides a third command at the second communications interface 182 responsive to the determined DOD of the battery 102 reaching the DOD threshold to control the charging circuit 126 to terminate charging of the battery 102. In one implementation, the battery gauge circuit 108 determines the DOD of the battery 102 periodically during the second charging operation, and the host processor 180 reads the DOD of the battery 102 from the battery gauge circuit 108 periodically during the second charging operation using the communications interfaces 122 and 181.

Figure 2:
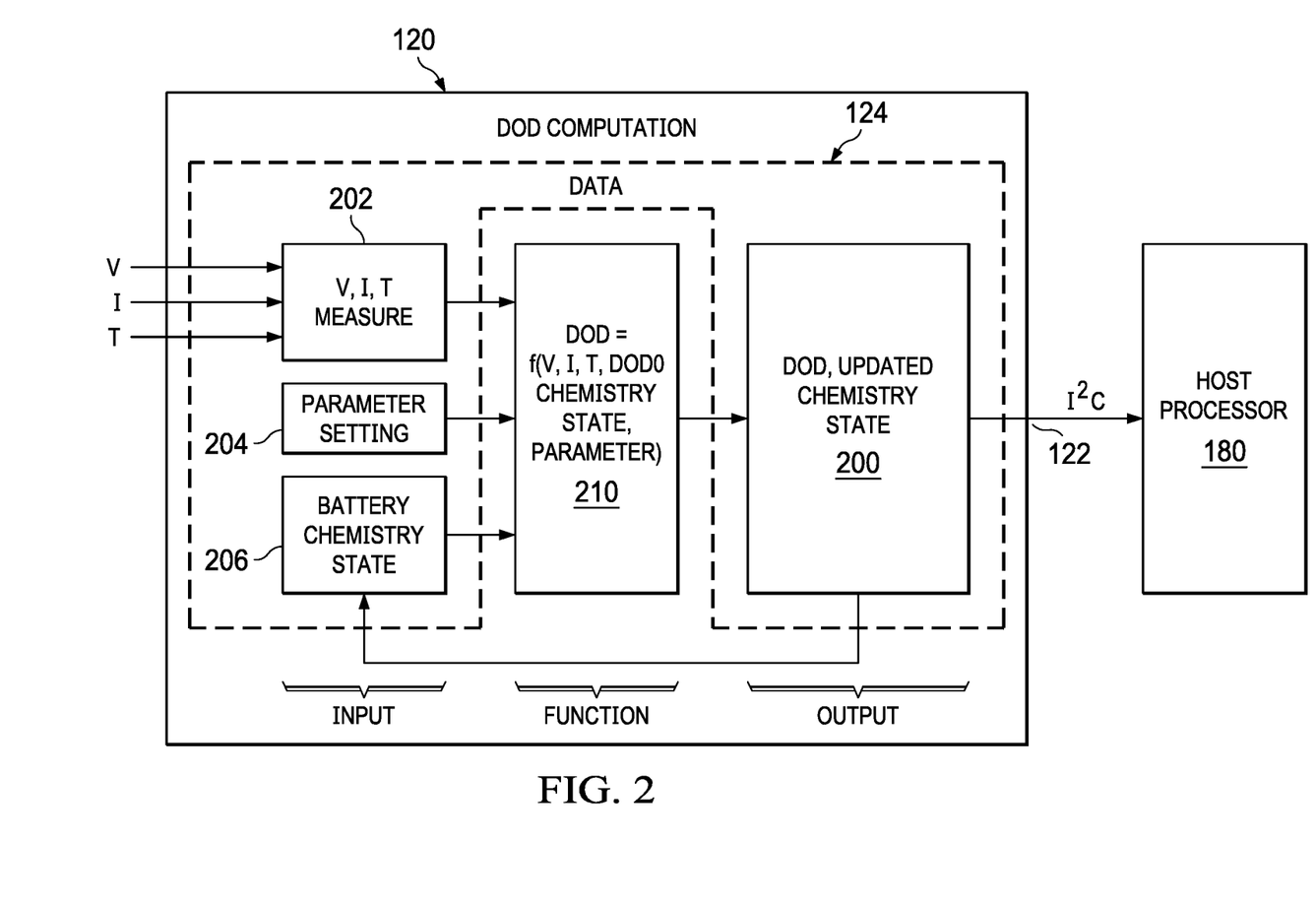
FIG. 2 is a schematic diagram showing further details of a depth of discharge computation circuit in the charging system of FIG. 1.

FIG. 2 shows further details of an example DOD computation circuit 120 of the charging system of FIG. 1. The DOD computation data 124 in this example includes the present determined DOD and updated battery chemistry state 200 of the battery 102, which is output to the host processor 180 via the gauge communications interface 122. The DOD computation data 124 also includes measured voltage (V), current (I), and temperature (T) values 202 received from the voltage, current, and temperature measurement and protection circuit 110, one or more parameter settings 204, and a battery chemistry state 206 that is updated periodically from the updated battery chemistry state 200 provided to the host processor 180. The measured values 202, the parameter settings 204, and the battery chemistry state 206 are inputs to a function 210 (e.g., DOD=f(V, I, T, DOD0, chemistry state, parameter) that relates these values to the DOD. In one example, the DOD computation circuit 120 evaluates or solves the function 210 periodically (e.g., every 1 second) to determine (e.g., compute or calculate) the present DOD value and battery chemistry state 200. In one example, the function 210 is or includes a parametric equation. In one example, the function 210 is or includes one or more lookup tables (LUTs), and the DOD computation circuit 120 implements interpolation functions to determines the present DOD value and battery chemistry state 200.

Figure 3:
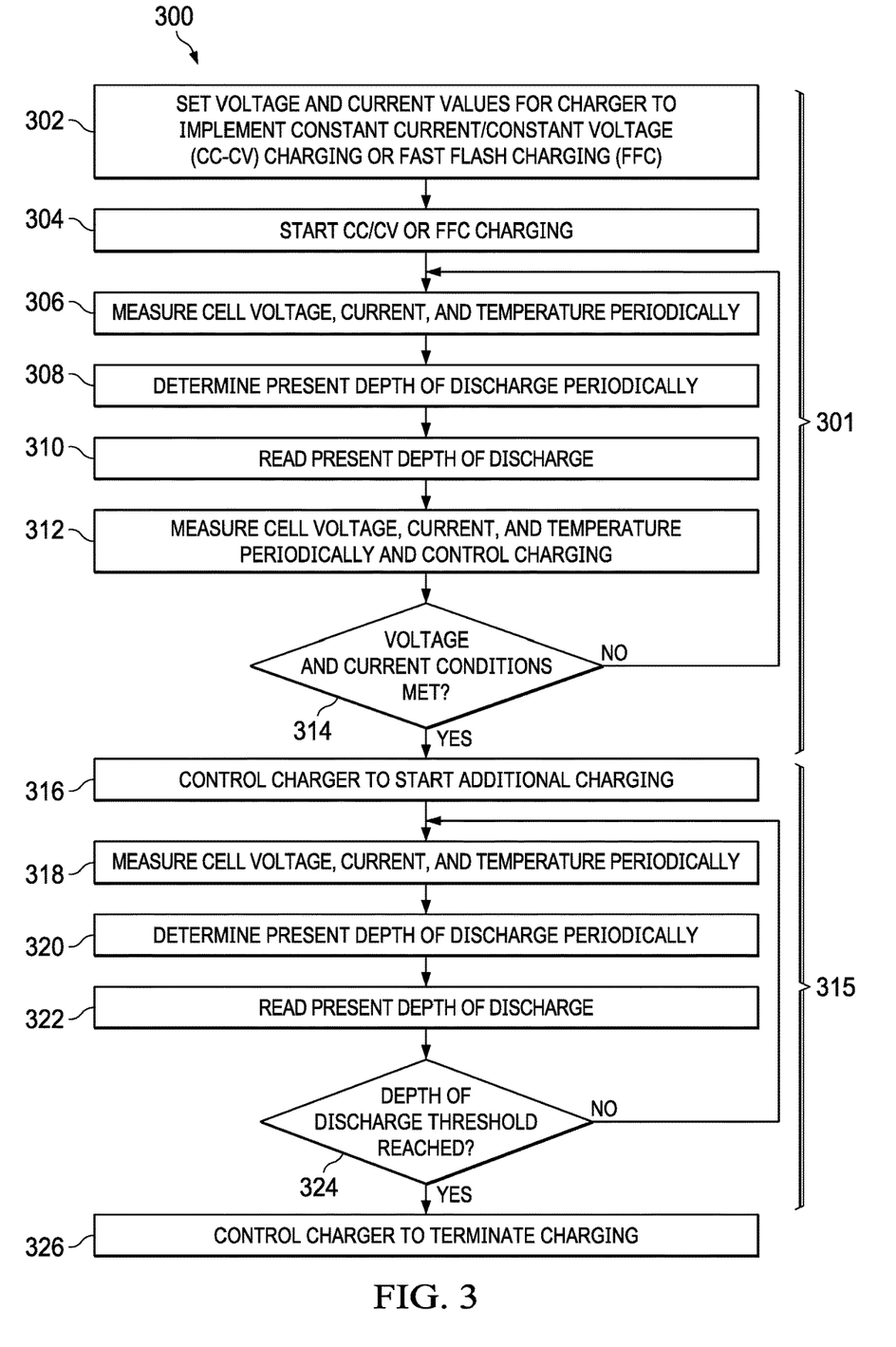
FIG. 3 is a flow diagram of a method of charging a battery.

FIG. 3 shows a method 300 that can be used for charging a battery, such as to charge the battery 102 in the charging system 100 of FIGS. 1 and 2 above. In one example, one or both of the host processor 180 and the battery gauge circuit 108 includes an electronic memory or other non-transitory computer-readable medium having computer-executable instructions which, when executed by the host processor 180 and/or a processor of the battery gauge circuit 108, cause the processor or these processors to implement all or portions of the method 300. The method 300 includes a first charging operation at 301 (including blocks 302, 304, 306, 308, 310, 312, and 314) and a second charging operation at 315 (including blocks 316, 318, 320, 322, and 324), referred to herein collectively as dual-mode charging. The second charging operation 315 enables additional charging and charging termination responsive to a determined DOD of the battery 102 reaching the DOD threshold, for example. In the illustrated example, the first charging operation 301 is terminated responsive to the voltage at the charger voltage sense input 132 reaching the first voltage value and the current at the charger current sense input 136 reaching the first current value.

At 302, the host processor 180 sets conditions for terminating the first charging operation. In one example, the host processor 180 provides a first command, which includes the first voltage value and the first current value, to the charging circuit 126 at 302. The commands can include multiple messages or a single message. The first command causes the charger 140 to charge the battery 102 to the first voltage value and the first current value in the first charging operation. The charger 140 starts CC/CV or FFC charging at 304 in response to receiving the first command from the host processor 180.

At 306, the battery gauge circuit 108 measures the battery voltage VB, the battery current IB, and the battery temperature T periodically, for example, every 1 second. At 308, the battery gauge circuit 108 determines the present DOD of the battery 102 periodically, for example, every 1 second. At 310, the host processor 180 reads the present DOD of the battery 102 from the battery gauge circuit 108 via the communications interfaces 122 and 181. At 312, the charging circuit 126 determines (measures) the voltage at the first battery terminal 104 relative to the voltage at the first charger current sense input terminal 134 and determines (measures) the battery current IB via the current sense input terminals 134 and 136. In one example, the charging circuit 126 also reads the battery temperature at 312. The charging circuit 126 controls charging of the battery 102 based on the present voltage, current, and temperature.

At 314, the charging circuit 126, in this example, determines whether the voltage and current conditions have been met. For example, the charging circuit 126 compares the voltage at the first battery terminal 104 relative to the voltage at the first charger current sense input terminal 134 with a voltage threshold VTH that represents the first voltage value. The charging circuit 126 determines the battery current IB based on a voltage across the current sense input terminals 134 and 136 and compares the current with a current threshold ITH that represents the first current value. The charging circuit 126 determines whether the first voltage value and the first current value provided by the host processor 180 in the first command have been met. If not (NO at 314), the method 300 returns to 306 as described above. In one example, the charging is constant current, constant voltage (CC/CV) charging during the first charging operation 301. In another example, the charging is flash fast charging (FFC) during the first charging operation 301.

If so (YES at 314), the method proceeds to 316. In one implementation, the charging circuit 126 determines that the voltage and current conditions have been met at 314 in response to the voltage reaching or exceeding the voltage threshold VTH that represents the first voltage value, and the battery current IB reaching or falling below the current threshold ITH that represents the first current value, as further illustrated and described below in connection with FIGS. 4, 5, and 6. In another implementation, the satisfaction of the voltage and current conditions includes each of these measured values being within a range that includes the respective first voltage value and the first current value.

In response to the voltage and current conditions being met (YES at 314), the host processor 180 controls the charging circuit 126 to perform the second charging operation at 315 and terminates the second charging operation responsive to the determined DOD of the battery 102 reaches the DOD threshold. In the illustrated implementation, the host processor 180 controls the charging circuit 126 at 316 to start additional charging in the second charging operation 315. In one example, the host processor 180 provides a second command via the communications interfaces 148 and 182 to control the charging circuit 126 to further charge the battery 102.

At 318, the battery gauge circuit 108 measures the battery voltage VB, the battery current IB, and the battery temperature T periodically, for example, every 1 second. At 320, the battery gauge circuit 108 determines the present DOD of the battery 102 periodically, for example, every 1 second, based on the battery voltage VB and the battery current IB. In one implementation, the present DOD is determined at 320 based on the battery voltage VB, the battery current IB, and the battery temperature T.

In one example at 318, the DOD computation circuit 120 determines the present DOD of the battery 102 according to the function (e.g., 210 in FIG. 2 above) as DOD=dod0+ Qpass/Qmax, where dod0 is determined by correlating a battery open circuit voltage (OCV) when the battery current IB is zero. The OCV is the open circuit voltage when no current flows into or out of the battery for a sufficiently long enough time to ensure that the battery voltage is very stable. For example, the relationship of DOD and OCV for a specific type of Li-Ion battery can be tested and characterized by an OCV curve of OCV as a function of DOD. An OCV curve enables determination of a battery DOD value for a given measured OCV value, referred to herein as DOD0. The pass charge value Qpass is the capacity flowing into or out of the battery and can be determined by accumulating the current flowing into or out of the battery over time. Qmax is the theoretical capacity that the battery can discharge from DOD=0 to DOD=100%. In another example, the DOD computation circuit 120 determines the present DOD of the battery 102 according to the function 210 using DOD0 determined from a root finding that satisfies the condition V_measured=OCV(DOD,T)+IB*R(DOD,T), where R is the internal resistance of the battery 102 as a function of DOD and temperature T. In yet another example, the DOD computation circuit 120 determines the present DOD of the battery 102 as a DOD determined by continuous DOD modeling during charge using an nRC equivalent circuit model, where "n" is a positive integer indicating the order of the RC equivalent circuit model of the battery 102 (e.g., 1RC, 2RC, 3RC, etc.). In another example, the DOD computation circuit 120 determines the present DOD of the battery 102 as a DOD determined by using Kalman filtering using an nRC equivalent circuit model. In yet another example, the DOD computation circuit 120 determines the present DOD of the battery 102 as a DOD determined by using recursive least squares estimation using an nRC equivalent circuit model.

At 322, the host processor 180 reads the present DOD of the battery 102 from the battery gauge circuit 108 via the communications interfaces 122 and 181. At 324, the host processor 180 determines whether the DOD has reached the DOD threshold. The host processor 180, in one implementation, determines whether the present determined DOD of the battery 102 from the battery gauge circuit 108 is within a range that includes the DOD threshold (e.g., within 1%). If the DOD threshold has not been reached (NO at 324), the additional charging in the second charging operation 315 continues at 318, 320 and 322 as described above. At 326, in response to the determined DOD of the battery 102 reaching the DOD threshold (YES at 324), the host processor 180 controls the charging circuit 126 to terminate charging of the battery 102. In one example, the host processor 180 provides a third command at 326 to control the charging circuit 126 to terminate charging of the battery 102.

Figure 4:
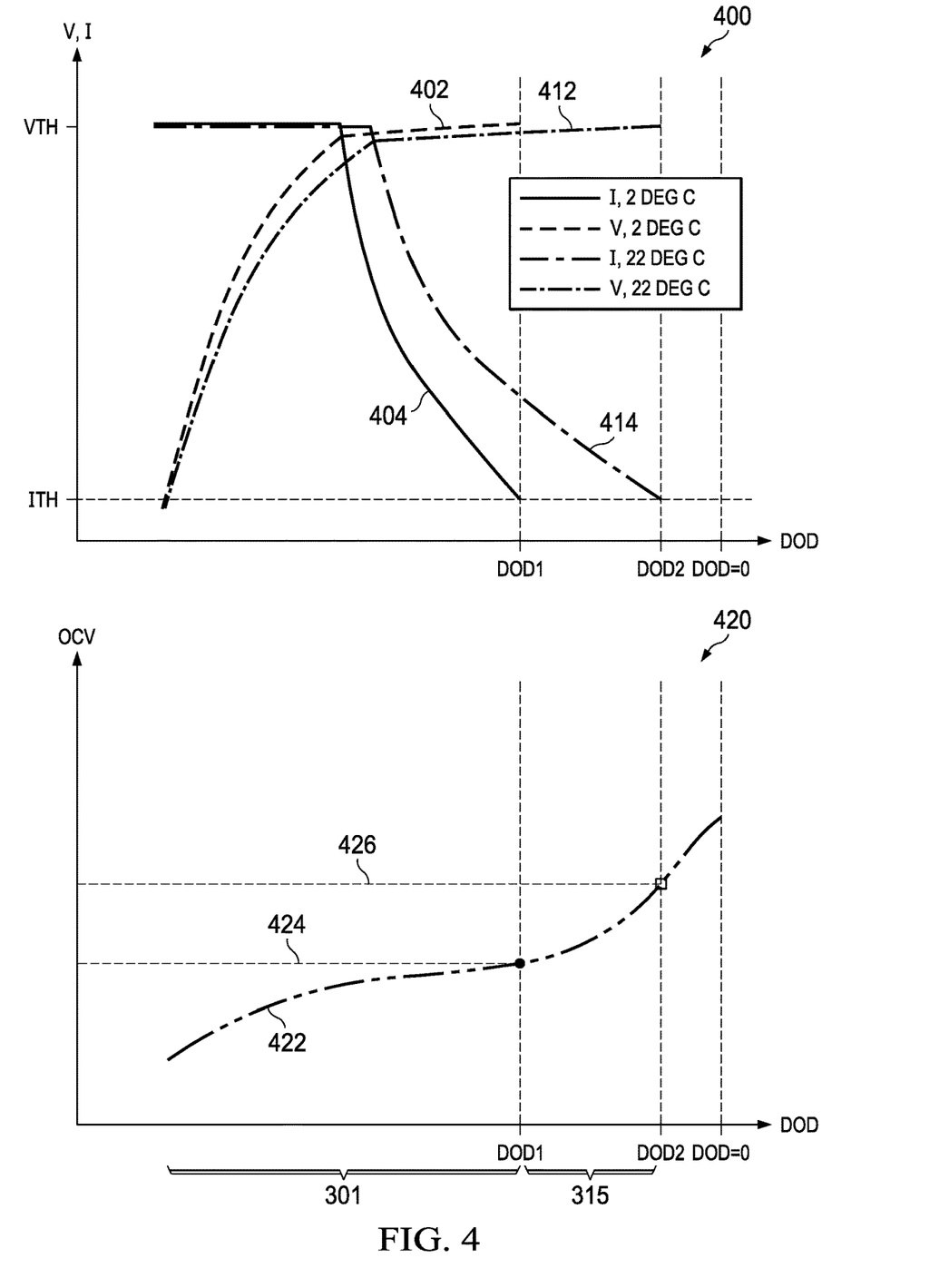
FIG. 4 is a signal diagram of voltage and current curves for charging batteries at different temperatures using constant current/constant voltage charging followed by additional charging according to depth of discharge and a signal diagram of open circuit voltage for the charged batteries.
Figure 5:
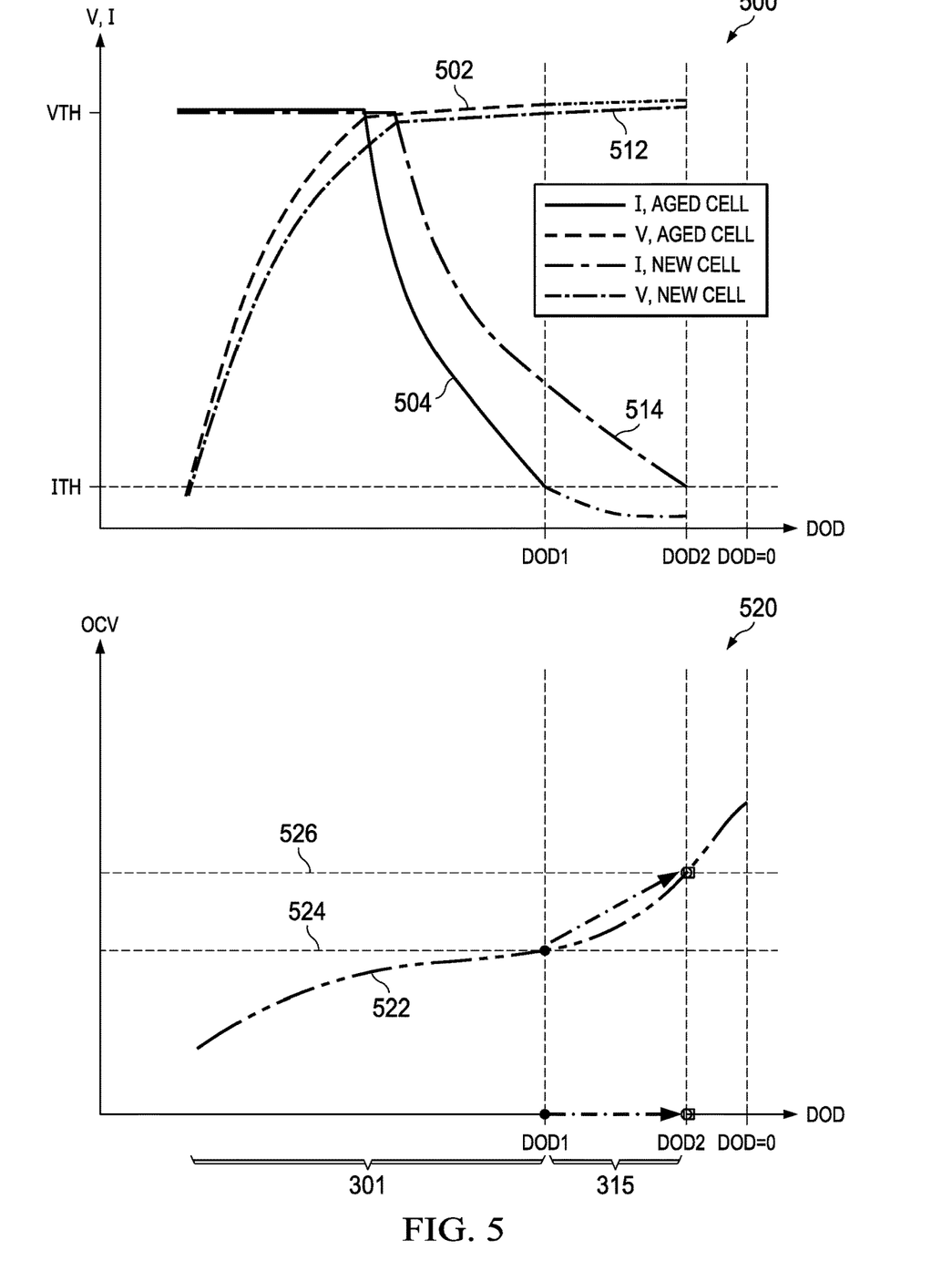
FIG. 5 is a signal diagram of voltage and current curves for charging new and aged batteries using constant current/constant voltage charging followed by additional charging according to depth of discharge and a signal diagram of open circuit voltage for the charged batteries.
Figure 6:
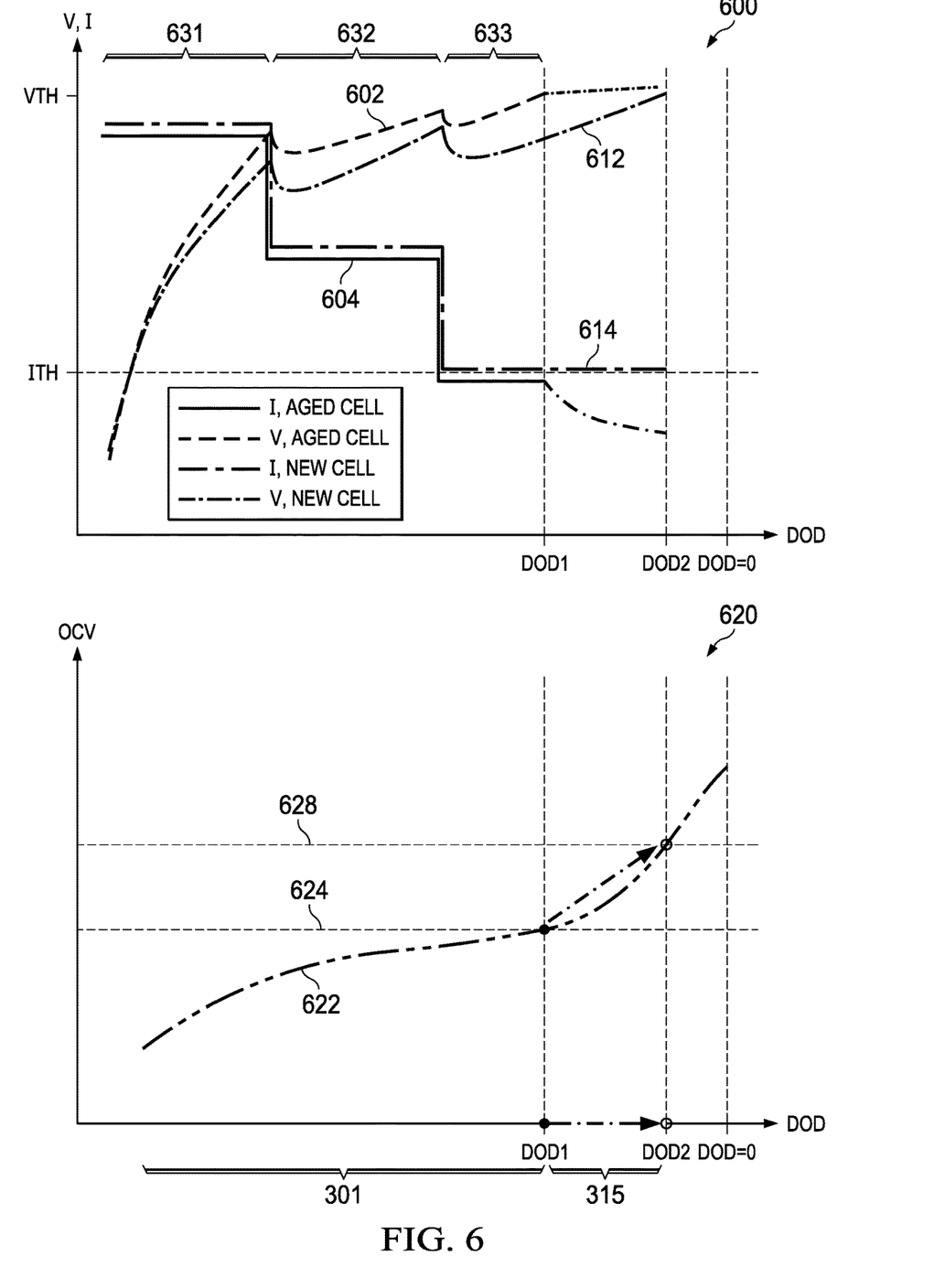
FIG. 6 is a signal diagram of voltage and current curves for charging new and aged batteries using flash fast charging followed by additional charging according to depth of discharge and a signal diagram of open circuit voltage for the charged batteries.

FIGS. 4-6 show examples of dual-mode charging using the method 300 and the system 100 described above. The dual-mode charging implemented by the host processor 180 using the charging circuit 126 and the battery gauge circuit 108 facilitates full or near-full charging of the battery 102 through termination of the second charging operation 315 based on the DOD. Using only CC/CV or FCC, even with current-voltage (IR) compensation, charge termination does not ensure a final DOD. CC/CV or FCC charging alone cannot repeatably stop charging at a threshold DOD when conditions change, such as cell aging, temperature, etc. Even with IR compensation, when a battery cell ages or is charged at low temperature, the internal resistance increases, leading to under-charging or over-charging using CC/CV or FCC alone.

FIG. 4 shows signal diagrams 400 and 420. The signal diagram 400 includes voltage and current curves for charging similar batteries at different temperatures. As shown in FIG. 1, the charger output voltage is applied to the series circuit including the battery 102 in addition to the components 160, 163, 166 and 170. Accordingly, the charger output voltages delivered and controlled by the charger 140, and as represented in FIG. 4, are not equal to the voltage VB of the battery 102. The diagram 400 shows charging operation with decreasing DOD from left to right on the horizontal axis using constant current/constant voltage charging in the first charging operation (e.g., 301 in FIG. 3 above, also designated in FIGS. 4 and 5) followed by additional charging in the second charging operation (e.g., 315) according to depth of discharge. The batteries in this example are charged using CC/CV charging during the first charging operation 301. The signal diagram 400 shows a voltage curve 402 and a current curve 404 for a battery charged at 2 degrees C. The diagram 400 also shows a voltage curve 412 and a current curve 414 for a battery charged at 22 degrees C., where the charged batteries are the same battery charged at two different temperatures or similar batteries that are charged at two different temperatures. Comparing the curves 402 and 404 with the curves 412 and 414 illustrates the different charging results achieved using CC/CV charging at two different temperatures for the same or similar batteries.

The voltage curves 402 and 412 increase with time during the first charging operation 301, eventually reaching the indicated voltage threshold VTH. Voltage threshold VTH corresponds to the first voltage value provided in the first command by the host processor 180. The charging current (curves 404 and 414) decreases with time during the first charging operation 301. The charger 140 provides a fixed charging current IB and the voltage reaches a level at or near the first voltage value VTH, in this example. Thereafter, the charger 140 regulates the voltage while the charging current IB decreases. The charger 140 terminates the first charging operation 301 responsive to the voltage being at or near the first voltage value VTH and the current reaching or falling below the indicated current threshold ITH. The current threshold corresponds to the first current value provided in the first command by the host processor 180.

The signal diagram 420 includes a curve 422 that illustrates the open circuit voltage (OCV) for the batteries charged at different temperatures in FIG. 4 along the same DOD horizontal axis. The first charging operation 301 terminates for the 2 degree C. battery at a DOD value DOD1. This charge amount corresponds to a first OCV value 424 in the signal diagram 420. The DOD threshold in this example is labelled DOD2, which corresponds to a second OCV value 426 that is greater than the first OCV value 424. The zero DOD value is also indicated in FIG. 4. The zero DOD value of a given OCV curve, such as the curve 422, represents the open circuit voltage of a fully charged battery for which the DOD=0%, and the state of charge (SOC) is 100%. As shown in FIG. 4, the OCV curve 422 extends past the DOD threshold DOD2 because the DOD threshold is not equal to the zero DOD value (e.g., DOD2 is set to a non-zero depth of discharge). The OCV curve 422 represents the open circuit voltage of the battery 102 throughout the entire DOD range from 100% for a fully discharged battery to the zero DOD value at which DOD=0%.

For the example 22-degree battery, the current curve 414 reaches the threshold ITH at a DOD corresponding to the DOD threshold DOD2. The DOD threshold DOD2, in turn, corresponds to the second OCV value 426 shown in the signal diagram 420, where the second OCV value 426 is greater than the first OCV value 424. Thus, the host processor 180 omits the second charging operation 315 for the battery charged at 22 degrees C. In other examples, the DOD threshold DOD2 does not correspond to the CC/CV or FFC charging termination point of a battery charged at room temperature. For instance, for the 2-degree battery, the current curve 404 reaches the threshold ITH at a higher value DOD1. Accordingly, the host processor 180 controls the charging circuit 126 to perform the second charging operation 315 and terminates the additional charging in response to the determined DOD reaching (e.g., equaling or falling below) the DOD threshold DOD2.

In one example for CC/CV charging with termination at the same fixed voltage point and current point, charging of a battery at 2 degrees C. terminated at a voltage of 4,414 mV and a current of 213 mA, and the open circuit voltage after 2-hour relaxation was 4361 mV. For this example, charging of a similar battery at 22 degrees C. terminated at a voltage of 4,414 mV and a current of 213 mA, but the open circuit voltage after 2-hour relaxation was 4388 mV. The OCV difference (e.g., 4388 mV vs. 4361 mV) corresponds to approximately 3~4% difference in DOD, and a 3~4% difference in battery capacity. This demonstrates the reduced charging result for the colder battery when the additional charging (e.g., at 315 in FIG. 3) is not performed.

FIG. 5 includes signal diagrams 500 and 520 and shows comparative voltage, current, and OCV curves for charging new and aged batteries. Namely, the signal diagram 500 has voltage curves 502 and 512 and current curves 504 and 514 for charging similar batteries of different ages. The signal diagram 520 has a curve 522 that illustrates the OCV for the batteries of different ages in the signal diagram 500. As shown in FIG. 1, the charger output voltage is applied to the series circuit including the battery 102 in addition to the components 160, 163, 166 and 170. Accordingly, the charger output voltages delivered and controlled by the charger 140, and as represented in FIG. 5, are not equal to the voltage VB of the battery 102. The diagram 500 shows charging operation with decreasing DOD from left to right on the horizontal axis using constant current/constant voltage charging in the first charging operation 301 followed by additional charging for the aged battery in the second charging operation 315 according to depth of discharge. The batteries in this example are charged using CC/CV charging during the first charging operation 301.

In particular, the diagram 500 shows the voltage curve 502 and the current curve 504 for an aged battery cell, as well as the voltage curve 512 and the current curve 514 for a new battery cell that is otherwise the same as or like the aged battery. The voltage curves 502 and 512 increase with time during the first charging operation 301, eventually reaching the indicated voltage threshold VTH. Voltage threshold VTH corresponds to the designated first voltage value provided in the first command by the host processor 180. The charging current (curves 504 and 514) decreases with time during the first charging operation 301.

The charger 140 provides a fixed charging current and the voltage rises and reaches the level at or near the first voltage value VTH. Thereafter, the charger 140 regulates the voltage, and the charging current IB decreases. The charger 140 terminates the first charging operation 301 once the voltage is at or near the first voltage value VTH and the current reaches or falls below the first current value ITH. The OCV curve 522 in the signal diagram 520 illustrates the OCV for the batteries charged in the signal diagram 500 along the same DOD horizontal axis. Comparing the curves 502 and 504 with the curves 512 and 514 illustrates the different charging results achieved using CC/CV charging for similar batteries of different ages. The OCV curve 522 represents the open circuit voltage of the battery 102 throughout the entire DOD range from 100% for a fully discharged battery to the zero DOD value at which DOD=0% for a fully charged battery.

The charger 140 terminates the first charging operation 301 for the aged battery cell at a DOD value DOD1. This charge amount corresponds to a first OCV value 524 in the signal diagram 520. Charging termination is responsive to the voltage (curve 502) meeting the first voltage value (e.g., within a range that includes the first voltage value VTH), and the current meeting the first current value, for example, the curve 504 decreasing to within a range that includes the first current value ITH. The DOD threshold in this example is labelled DOD2, which corresponds to a second OCV value 526 that is greater than the first OCV value 524. For the example new battery cell, the current curve 514 reaches the threshold ITH at a DOD corresponding to the DOD threshold DOD2. Thus, the host processor 180 omits the second charging operation 315 for the new battery cell.

In other examples, the DOD threshold DOD2 does not correspond to the CC/CV or FFC charging termination point of a new battery cell. For example, for the aged battery, the current curve 504 reaches the threshold ITH at a higher value DOD1. Accordingly, the host processor 180 controls the charging circuit 126 to perform the second charging operation 315 for the aged battery. The charging circuit 126 terminates the additional charging of the aged battery in response to the determined DOD reaching (e.g., equaling or falling below) the DOD threshold DOD2 (e.g., decreasing to within a range that includes the DOD threshold DOD2). For an aged battery cell (or a battery at low temperature per FIG. 4 above), the impedance of the cell increases. With the fixed voltage threshold and current threshold used in terminating the first charging operation 301 alone, the cell may not be fully charged to the DOD threshold level DOD2.

The illustrated examples advantageously employ additional charging in the second charging operation 315 with termination at a higher OCV on the respective curves 422 and 522, which correspond to a lower DOD value DOD2 nearer the fully charged (DOD=0) state. The additional charging in the second charging operation 315, in one example, is the same generally constant voltage that was used in the first charging operation (e.g., at or within 5% of VTH in FIGS. 4 and 5), with lower current. In another example, the additional charging in the second charging operation 315 is performed at a higher voltage than was used in the first charging operation 301, with the same current. In other implementations, other charging methods are used in the second charging operation 315, with termination based on the determined DOD reaching the DOD threshold.

FIG. 6 includes signal diagrams 600 and 620 that show comparative voltage, current, and OCV curves for charging new and aged batteries, in which the first charging operation 301 uses FFC. Signal diagram 600 includes voltage curves 602 and 612, and current curves 604 and 614 for charging similar batteries of different ages using flash fast charging, followed by additional charging according to depth of discharge. Signal diagram 620 illustrates open circuit voltage (OCV) for the charged batteries along the DOD axis. The diagrams 600 and 620 show charging operation with decreasing DOD from left to right on the horizontal axis in the first charging operation 301 followed by additional charging in the second charging operation 315 according to depth of discharge. The batteries in this example are charged using FFC charging during the first charging operation 301.

In particular, the signal diagram 600 shows a voltage curve 602 and a current curve 604 for an aged battery cell, as well as a voltage curve 612 and a current curve 614 for a new battery cell. As shown in FIG. 1, the charger output voltage is applied to the series circuit including the battery 102 in addition to the components 160, 163, 166 and 170. Accordingly, the charger output voltages delivered and controlled by the charger 140, and as represented in FIG. 6, are not equal to the voltage VB of the battery 102. The voltage curves 602 and 612 increase with time during each of three segments 631, 632, and 633 of the FFC first charging operation 301, eventually reaching the indicated voltage threshold VTH. The voltage threshold VTH corresponds to the first voltage value provided in the first command by the host processor 180. The Example of FIG. 6 shows three segments 631, 632, and 633. In other implementations, any integer number of two or more segments are used.

The charging current (curves 604 and 614) is maintained at successively reduced, generally constant, current levels in the respective segments 631, 632, and 633. The current for each curve 604 and 614 starts at a highest current level in the first segment 631. The current decreases to an intermediate current level in the second segment 632 and decreases further to a lowest current in the third segment 633, during the first charging operation 301. The charger 140 provides the lowest charging current in the third segment 633, and the voltage reaches the level at or near the first voltage value VTH. Thereafter, the charger 140 terminates the first charging operation 301 responsive to the voltage being at or near the first voltage value VTH and the current reaching (e.g., equaling or falling below) the first current value ITH.

The charger 140 terminates the first charging operation 301 for the aged battery cell responsive to the voltage (curve 602) meeting the first voltage value (e.g., within a range that includes the first voltage value VTH) and the current meeting the first current value, for example, the curve 604 decreasing to within a range that includes the first current value ITH. The aged battery cell has a DOD value DOD1 when the charger 140 terminates the first charging operation 301. This charge amount corresponds to a first OCV value 624 in the signal diagram 620. The DOD threshold in this example is labelled DOD2, which corresponds to a second OCV value 626 that is greater than the first OCV value 624. The zero DOD value is also indicated in FIG. 6. For the example new battery cell, the voltage curve 612 reaches the threshold VTH and the new battery has a DOD that corresponds to the DOD threshold DOD2. In this example, the host processor 180 omits the second charging operation 315 for the new battery cell.

In other examples, the DOD threshold DOD2 does not correspond to the FFC charging termination point of a new battery cell. For instance, for the aged battery, the voltage 602 reaches the threshold VTH at a higher value DOD1. In this example, the host processor 180 controls the charging circuit 126 to perform the second charging operation 315 and terminates the additional charging of the aged battery in response to the determined DOD reaching (e.g., equaling or falling below) the DOD threshold DOD2 (e.g., decreasing to within a range that includes the DOD threshold DOD2).

Figure 7:
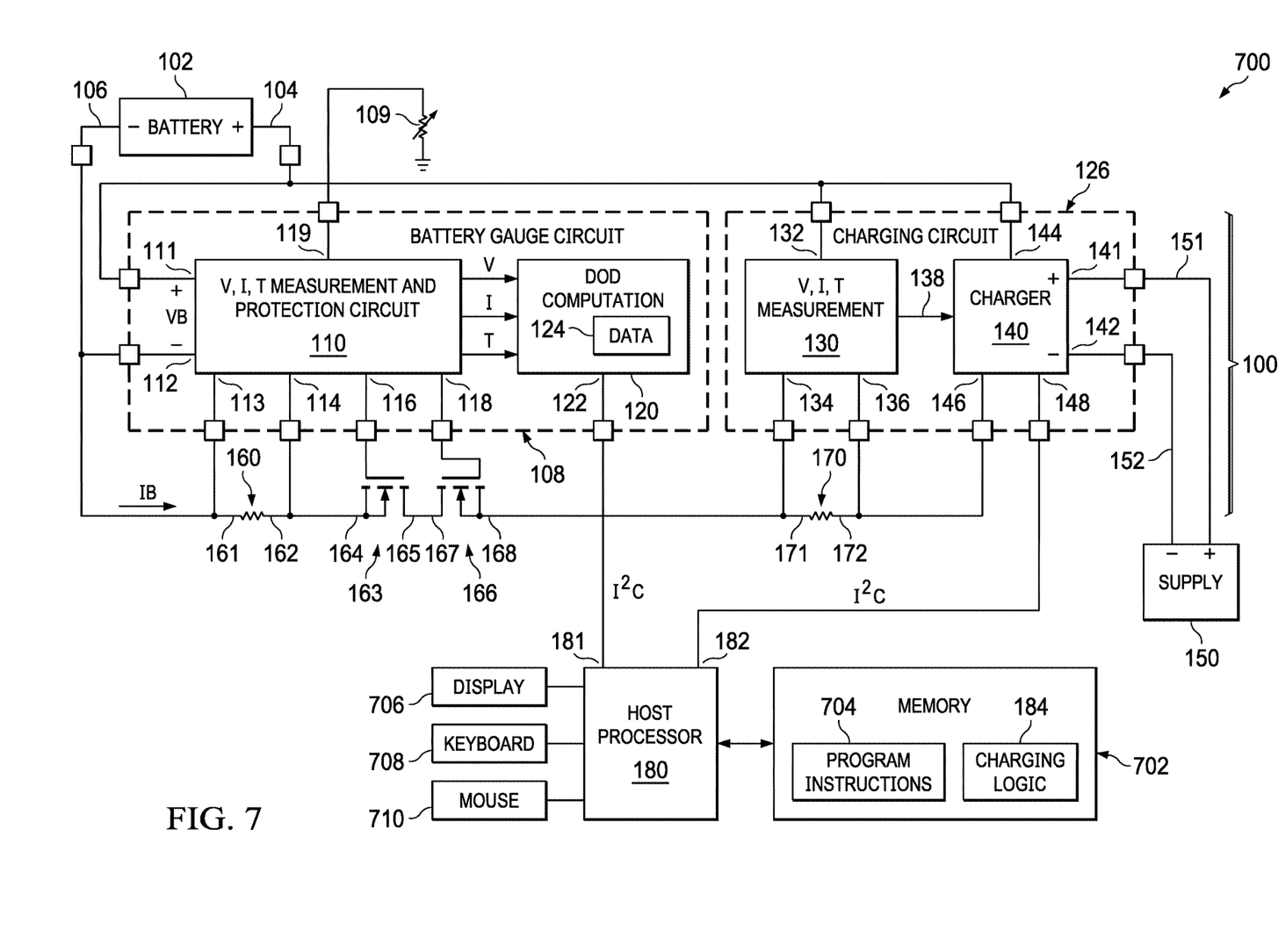
FIG. 7 is a schematic diagram of an electronic device having a battery charging system.

FIG. 7 shows an electronic device 700 having a battery charging system 100 including the same components labeled and as described above in connection with FIGS. 1 and 2. The electronic device 700 in one example is a smart phone or notebook/laptop computer with an internal battery 102 and charging system 100 that selectively operates when externally powered to charge the internal battery 102. The electronic device 700, in this example, also includes an electronic memory 702 that stores program instructions 704 and includes charging logic 184 to implement the method 300 described above. In this example, the electronic device 700 further includes a display 706, a keyboard 710, and a mouse 710.

In the electronic device 700 of FIG. 7, the battery 102 has a first terminal 104 and a second terminal 106. The battery charging system 100 has a battery gauge circuit 108 and a charging circuit 126, as described above. The battery gauge circuit 108 has a gauge voltage sense input with terminals 111 and 112, a gauge current sense input with terminals 113 and 114, and a gauge communications interface 122. The gauge voltage sense input is coupled to the first and second terminals 103, 104 of the battery 102. The battery gauge circuit 108 determines the DOD of the battery 102 based on the battery voltage VB measured at the gauge voltage sense input and the battery current IB measured at the gauge current sense input.

The charging circuit 126 has a charger voltage sense input 132, a charger current sense input 136, a charger output with terminals 144 and 146, and a charger communications interface 148. The charging circuit 126 delivers a charging current at its output to charge the battery 102 responsive to a command received at the charger communications interface 148. The electronic device 1000 also includes the host processor 180 with a first communications interface 181 and a second communications interface 182. The first communications interface 181 is coupled to the gauge communications interface 122, and the second communications interface 182 is coupled to the charger communications interface 148. The host processor 180 controls the charging circuit 126 to terminate charging of the battery 102 responsive to the DOD of the battery 102, determined by the battery gauge circuit 108, reaching a depth of discharge threshold.

Figure 8:
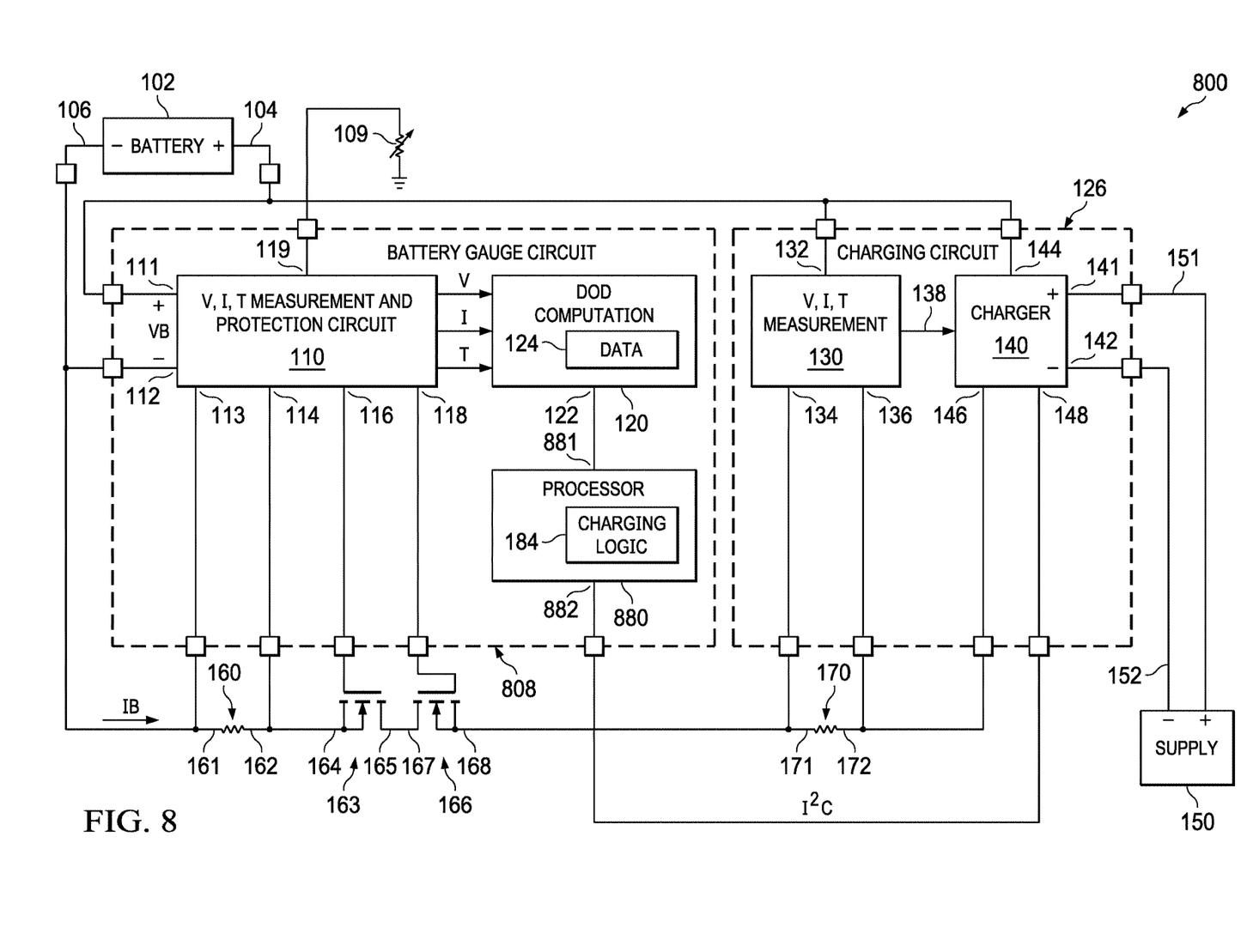
FIG. 8 is a schematic diagram of another battery charging system to charge a battery based on depth of discharge.

FIG. 8 shows a battery charging system 800 to charge a battery based on depth of discharge. The charging system 800 includes several of the same components labeled and as described above in connection with FIGS. 1 and 2 but, instead of the battery gauge circuit 108, includes the battery gauge circuit 808. In this example, the battery gauge circuit 808 includes the voltage, current, and temperature measurement and protection circuit 110 and the DOD computation circuit 120 as described above. The battery gauge circuit 808 also includes a processor 880 having a first communications interface 881 and a second communications interface 882. The first communications interface 881 is coupled to the gauge communications interface 122 of the DOD computation circuit 120. In one example, the first communications interface 881 is an inter-integrated circuit I²C bus or an SMBus v1.1 compatible interface. The second communications interface 882 is coupled to the charger communications interface 148 of the charger 140 to control termination of charging as described above in connection with FIGS. 1-3. In one example, the second communications interface 882 is an I²C bus or an SMBus v1.1 compatible interface. In one implementation, the processor 880 implements the dual-mode or two-step charging described above including first and second charging operations, for example, by implementing the method 300 to charge the battery 102.

In one implementation, the processor 880 also implements the DOD computation functions of the illustrated DOD computation circuit 120 in a single processor. In another implementation (not shown), a processor is included within the charging circuit 126 and includes a communications interface coupled to the gauge communications interface 122 of the DOD computation circuit 120. In this implementation, the processor is configured (e.g., by suitable program instructions) to implement the functions of the charging circuit described above in addition to the dual-mode or two-step charging operations, for example, by implementing the method 300 to charge the battery 102. In yet another implementation (not shown), the battery gauge circuit 808, the charging circuit 126, and the processor 880 are included in a single packaged electronic device. In this example, the processor 880 and the circuits 808 and 126 can be implanted in three separate respective dies packaged together and interconnected in a shared package structure that forms a single packaged electronic device. Alternatively, two or more of the processor 880 and the circuits 808 and 126 can be implemented in the same die within a shared device package structure.

As previously discussed, in at least one example, the battery gauge circuit 108 is or includes a BQ27Z561-R2 battery gauge packaged electronic device available from Texas Instruments Incorporated of Dallas Texas. In this implementation, the battery gauge circuit 108 includes internal circuit components, such as transistors, resistors, capacitors, programmed and/or programmable processing or logic circuits and components, and I$^2$C-compatible communications interface circuitry and components configured to facilitate accurate gas gauging applications. Integrated temperature sense functions and circuits, including internal and external options, in this implementation enable system and battery temperature measurements.

The battery gauge circuit 108 in this example has a flash programmable custom reduced instruction-set CPU (RISC) and authentication for Li-ion and Li-polymer battery packs. Integrated secure hash algorithm functionality, such as SHA-256, helps enable secure identification between systems and packs. The battery gauge circuit 108 in this example also provides interrupt or data exchange functions to periodically determine and report the DOD to the processor 180 or 880 and to inform the processor 180 of 880 when a specific state-of-charge (SOC), voltage, or temperature condition occurs during powered operation. This example further implements a low-voltage operating mode that enables the system to continue monitoring the battery 102 even in deeply discharged conditions. During low-activity situations, the battery gauge circuit 108 in this example can be set to implement a low power coulomb counting (CC) mode, which enables the device to continue its coulomb counting while reducing operating current significantly.

As previously discussed, in at least one example, the charging circuit 126 is or includes a BQ25306 integrated standalone switch-mode battery charger packaged electronic device available from Texas Instruments Incorporated of Dallas Texas. In this implementation, the charging circuit 126 includes circuitry, such as transistors, resistors, capacitors, programmed and/or programmable processing or logic circuits and components, and an I$^2$C-compatible communications interface. The charging circuit 126 in this example implements processor or user selectable or configurable CC/CV or fast charging technology such as fast flash charging. The charging circuit 126 in this example includes integrated current sensing circuitry that enables high charge efficiency and low cost with low quiescent current operation to help conserve battery energy and enhance shelf time for portable devices such as the electronic device 700 of FIG. 7 above.

Modifications are possible in the described examples, and other implementations are possible, within the scope of the claims.

What is claimed is:

1. A method comprising:
  charging a battery including performing first and second charging operations;
  measuring a voltage of the battery periodically;
  measuring a current of the battery periodically;
  measuring a temperature of the battery periodically;
  calculating a depth of discharge of the battery based on the voltage, current, and temperature of the battery;
  comparing the calculated depth of discharge to a discharge threshold; and
  terminating the charging the battery in response to the calculated depth of discharge being equal to or below the discharge threshold, and continuing the charging the battery in response to the calculated depth of discharge being above the discharge threshold.

2. The method of claim 1, wherein the depth of discharge is calculated during the second charging operation.

3. The method of claim 1, further comprising:
  providing a first command to control a charging circuit to charge the battery in the first charging operation, the first command including a voltage threshold and a current threshold;
  providing a second command to control the charging circuit to further charge the battery in the second charging operation; and
  providing a third command, responsive to the calculated depth of discharge of the battery reaching the discharge threshold, to control the charging circuit to terminate the second charging operation.

4. The method of claim 1, wherein the depth of discharge is calculated periodically during charging of the battery.

5. The method of claim 1, further comprising:
  controlling a charging circuit to charge the battery based on a first voltage value and a first current value; and
  controlling the charging circuit to further charge the battery after the voltage of the battery reaches the first voltage value and the current of the battery reaches the first current value, wherein controlling terminating charging of the battery includes controlling the charging circuit to terminate the further charging of the battery.

6. The method of claim 1, wherein the depth of discharge of the battery is calculated based on a battery chemistry state.

7. An electronic device comprising:
  a battery having a first terminal and a second terminal;
  a battery gauge circuit having a gauge voltage sense input, a gauge current sense input, a gauge temperature sense input, and a gauge communications interface, wherein the gauge voltage sense input is coupled to the first and second terminals of the battery, and the battery gauge circuit is configurable to periodically calculate a depth of discharge of the battery based on a battery voltage at the gauge voltage sense input, a battery temperature provided at the gauge temperature sense input, and a battery current at the gauge current sense input;
a charging circuit; and
a processor coupled to the battery gauge circuit and the charging circuit, wherein the processor is configurable to:
control the charging circuit to charge the battery in a first charging operation and terminate charging of the battery responsive to the depth of discharge reaching a depth of discharge threshold;
following termination of the first charging operation, control the charging circuit to further charge the battery in a second charging operation; and
responsive to the depth of discharge reaching the depth of discharge threshold, control the charging circuit to terminate the second charging operation.

8. A system comprising:
a battery gauge circuit having a voltage sense input, a current sense input, and a temperature sense input, wherein the battery gauge circuit is configurable to calculate a depth of discharge of a battery based on a battery voltage at the voltage sense input, a battery current at the current sense input, and a temperature at the temperature sense input; and
a processor coupled to the battery gauge circuit, the processor configurable to control charging of the battery responsive to the calculated depth of discharge reaching a depth of discharge threshold, wherein the processor is configurable to:
control terminating charging the battery in a first charging operation based on comparing a measured battery voltage to a threshold voltage value, and a measured current value to a threshold current value;
after termination of the first charging operation, control charging the battery in a second charging operation; and
control terminating the second charging operation responsive to the calculated depth of discharge reaching the depth of discharge threshold.

9. The system of claim 8, wherein:
the battery gauge circuit is configurable to calculate the depth of discharge of the battery periodically during the second charging operation; and
the processor is configurable to read the calculated depth of discharge periodically during the second charging operation.

10. The system of claim 9, wherein:
the battery gauge circuit is configurable to calculate the depth of discharge of the battery periodically during the first charging operation; and
the processor is configurable to read the calculated depth of discharge periodically during the first charging operation.

11. The system of claim 8, wherein the processor includes a communications interface and is configurable to:
provide a first command at the communications interface to control charging the battery in the first charging operation, the first command including the threshold voltage value and the threshold current value;
provide a second command at the communications interface to further charge the battery in the second charging operation; and
provide a third command at the communications interface responsive to the depth of discharge of the battery calculated by the battery gauge circuit reaching the depth of discharge threshold to terminate charging of the battery.

12. The system of claim 8, wherein the processor is configurable to provide a command, responsive to the calculated depth of discharge of the battery reaching the depth of discharge threshold, to control a charging circuit to terminate charging of the battery.

13. The electronic device of claim 7, wherein:
the battery gauge circuit is configurable to calculate the depth of discharge of the battery periodically during the second charging operation; and
the processor is configurable to receive the depth of discharge of the battery from the battery gauge circuit periodically during the second charging operation.

14. The electronic device of claim 7, wherein the processor is configurable to:
provide a first command to control the charging circuit to charge the battery in the first charging operation, the first command including a voltage threshold and a current threshold, and to terminate the first charging operation in response to the battery voltage at the gauge voltage sense input reaching the voltage threshold and the battery current at the gauge current sense input reaching the current threshold;
provide a second command to control the charging circuit to further charge the battery in the second charging operation; and
provide a third command, responsive to the depth of discharge reaching the depth of discharge threshold, to control the charging circuit to terminate the further charging of the battery in the second charging operation.

* * * * *